United States Patent
Haba et al.

(10) Patent No.: US 7,683,468 B2
(45) Date of Patent: Mar. 23, 2010

(54) ENABLING UNIFORMITY OF STACKING PROCESS THROUGH BUMPERS

(75) Inventors: Belgacem Haba, Saratoga, CA (US); Ilyas Mohammed, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 408 days.

(21) Appl. No.: 11/645,016

(22) Filed: Dec. 21, 2006

(65) Prior Publication Data
US 2008/0150113 A1   Jun. 26, 2008

(51) Int. Cl.
 *H01L 23/48* (2006.01)
 *H01L 23/02* (2006.01)
(52) U.S. Cl. .................... 257/686; 257/723; 257/777; 257/784; 257/E23.169
(58) Field of Classification Search .............. 257/686, 257/777, 784, 723, E23.169
See application file for complete search history.

(56) References Cited

U.S. PATENT DOCUMENTS

| | | | |
|---|---|---|---|
| 5,222,014 A | | 6/1993 | Lin |
| 5,291,061 A | * | 3/1994 | Ball ............................ 257/686 |
| 6,020,629 A | * | 2/2000 | Farnworth et al. .......... 257/686 |
| 6,051,878 A | * | 4/2000 | Akram et al. ................ 257/686 |
| 6,093,969 A | * | 7/2000 | Lin .............................. 257/777 |
| 6,495,895 B1 | * | 12/2002 | Peterson et al. ............. 257/434 |
| 6,686,656 B1 | * | 2/2004 | Koh et al. .................... 257/686 |
| 6,897,565 B2 | | 5/2005 | Pflughaupt et al. |
| 6,977,440 B2 | | 12/2005 | Pflughaupt et al. |
| 7,312,519 B2 | * | 12/2007 | Song et al. ................... 257/686 |
| 2001/0040282 A1 | * | 11/2001 | Corisis et al. ............... 257/686 |
| 2003/0006494 A1 | * | 1/2003 | Lee et al. ..................... 257/686 |
| 2003/0102546 A1 | * | 6/2003 | Lee et al. ..................... 257/686 |
| 2005/0285246 A1 | | 12/2005 | Haba et al. |
| 2007/0156810 A1 | * | 7/2007 | Kumar ........................ 709/203 |

OTHER PUBLICATIONS

Haba et al., U.S. Appl. No. 11/318,164, filed Dec. 23, 2005, entitled "Microelectronic Assemblies Having Very Fine Pitch Stacking."

* cited by examiner

*Primary Examiner*—Nitin Parekh
(74) *Attorney, Agent, or Firm*—Lerner, David, Littenberg, Krumholz & Mentlik, LLP

(57) ABSTRACT

A stacked semiconductor chip assembly is disclosed, as are different embodiments relating to same. The stacked chip assembly preferably includes a plurality of units which include a substrate with microelectronic components mounted on each. The individual units desirably are thin and directly abut one another so as to provide a low-height assembly and uniform spacing. Warping of the stacked package is desirably limited by placing bumpers between adjacent units to provide a balanced support, while applying a downward pressure on the units during reflow to control height tolerances.

16 Claims, 2 Drawing Sheets

US 7,683,468 B2

ENABLING UNIFORMITY OF STACKING PROCESS THROUGH BUMPERS

BACKGROUND OF THE INVENTION

Microelectronic elements such as semiconductor chips are typically provided in packages which provide physical and chemical protection for the semiconductor chip or other microelectronic element. Such a package typically includes a package substrate such as a small circuit panel formed from a dielectric material and having electrically conductive terminals thereon. The chip is preferably mounted on the package substrate and electrically connected to the terminals of the package substrate. Typically, the chip and portions of the substrate are covered by an encapsulant or overmolding, so that only the terminal-bearing outer surface of the substrate remains exposed. The encapsulant commonly is molded in place on the dielectric layer so that the mass of encapsulant has a preselected shape, and so that the encapsulant covers the microelectronic device. The encapsulant may also cover features such as wire bonds which form part of the connection between the chip and the terminals. Such packages may be stacked. In a stacked assembly, individual chip packages or units are mounted one above the other in a common assembly. This common assembly can be mounted on an area of the circuit panel which may be equal to or just slightly larger than the area typically required to mount a single package or unit containing a single chip. This stacked package approach conserves space on the circuit panel.

One form of stacked package assembly which has been proposed heretofore is sometimes referred to as a "ball stack." A ball stack assembly includes two or more individual units. Each unit incorporates a unit substrate similar to an individual package substrate, and one or more microelectronic elements mounted to the unit substrate and connected to the terminals on the unit substrate. The individual units are stacked one above the other, with the terminals on each individual unit substrate being connected to terminals on another unit substrate by electrically conductive bonding material such as solder balls, thus forming a plurality of vertical conductors. The terminals of the bottom unit substrate may constitute the terminals of the entire assembly or, alternatively, an additional substrate may be mounted at the bottom of the assembly which may have terminals connected to the terminals of the various unit substrates. Ball stack packages are depicted, for example, in certain preferred embodiments of U.S. Published Patent Applications 2003/0107118 and 2004/0031972, now U.S. Pat. Nos. 6,897,565 and 6,077,440 respectively, the disclosures of which are hereby incorporated by reference herein. The individual units in stacked packages can be permanently bonded in place by heating the assembly so as to melt or "reflow" the solder balls or otherwise activate the bonding material.

Despite all of the innovations discussed above, there remains room for improvement. There exists a need to better control the spacing between chip units in a stacked package. A ball stack package which undergoes reflow depends on forces such as surface tension of the molten solder and the weight of the units to bring the units to their final vertical spacing during reflow. Moreover, the individual units may be warped. If the warpage exceeds a certain amount, a solder ball on one unit will not contact the terminal on the adjacent unit during reflow, and the connection will not be made. Warpage may occur in either an upward or a downward direction. One side of each unit may warp downwardly, while the other side of the unit may warp upwardly. The bottom solder balls may collapse excessively due to weight. In addition, the height of the assembly may vary with variations in solder ball size, the exposed surface area of the terminals and the like. These and other factors may cause substantial variation in the height of assemblies which include many layers.

SUMMARY OF THE INVENTION

One aspect of the invention provides methods for manufacturing and assembling a stacked package assembly. While many different techniques may be employed, a method according to this aspect consists of providing a plurality of units superposed on one another in a stack. Each unit desirably includes a substrate with attached microelectronic components. The method desirably includes providing bumpers between at least one pair of adjacent units. The method preferably includes the steps of depositing electrically conductive bonding material between said units and reflowing the bonding material to electrically connect the units to form a plurality of vertical buses. The method also desirably includes the step of forcibly urging the units toward one another during reflow until the bumpers bear against the adjacent unit and the bumpers limit collapse of the bonding materials. In other aspects of the invention, a frame is provided for to secure the units as they are being assembled. A fitted lid may be used to facilitate the step of forcibly urging the units toward one another.

Each unit may include a central region and a peripheral regional, and one or more of the bumpers may be disposed in the peripheral region. For example, a unit may include a bond window extending through the unit substrate in the central region. Electrical connections may be provided in the window, as by wire bonds extending through the window forming electrical connections to the microelectronic component. The unit also may include an encapsulant in the bond window such that the encapsulant defines one of bumpers in addition to other bumpers on either side of the bumper defined by the encapsulant.

A further aspect of the invention provides a plurality of units which are superposed on one another in a stack as discussed above. Here again, the units preferably include a substrate with attached microelectronic components and a plurality of bumpers disposed between at least one pair of adjacent units. The units may be superposed on one another in a stack such that the bumpers provide a support structure between the top and bottom surfaces of adjacent units. The assembly also preferably includes electrically conductive bonding material electrically which connect the units in the stack to form a plurality of vertical buses. In yet another aspect of the invention, the assembly of includes a lid overlying a top most unit in the stack.

BRIEF DESCRIPTION OF THE DRAWINGS

A more complete appreciation of the subject matter of the present invention and the various advantages thereof can be realized by reference to the following detailed description in which reference is made to the accompanying drawings in which.

DETAILED DESCRIPTION

Figure 1:
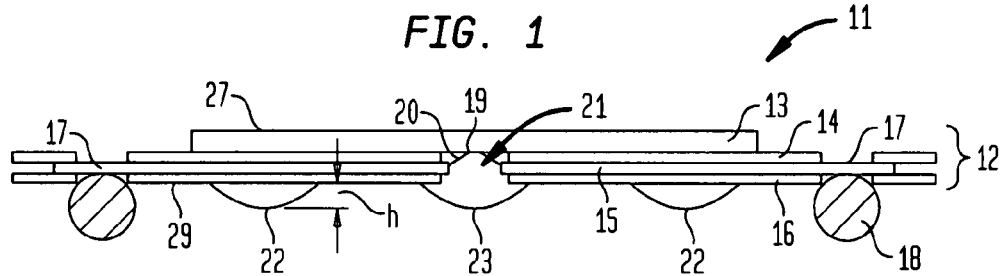
FIG. 1 is a diagrammatic sectional view of one unit used in one embodiment of the invention.

A stacked package assembly in accordance with one embodiment of the invention uses a plurality of package elements referred to as units 11 as shown in FIG. 1. Each unit 11 includes a substrate 12 and microelectronic chip 13. The substrate is comprised of a dielectric layer 14, and electrically conductive trace layer 15, and a solder mask layer 16. The chip 13 defines the top surface 27 of the unit, whereas the solder mask layer 16 defines the bottom surface 29 of the unit. The trace layer 15 also includes numerous terminals 17 disposed in rows within the peripheral region of the substrate. A reflowable electrically conductive bonding material such as solder balls 18 is used to electrically connect the units together forming vertical buses. It is to be understood, that any type, size, shape or configuration substrates, components, bumpers and/or electrically conductive bonding material may be utilized. For example, the electrically conductive bonding material 18 may be solid core solder balls, or balls constructed completely of solder. Similarly, such connection elements may include pins, rods, or other structural and/or conductive elements. For example, as discussed in U.S. Published Patent Application No. 20050285246 and U.S. patent application Ser. No. 11/318,164, the disclosures of which are hereby incorporated by reference herein, the conductive elements may include both pins and reflowable solder masses bonded to the pins. The center region of the chip 13 includes contacts 19. The dielectric layer 14 has a bond window 31 disposed in alignment with the contacts. Lead bonds 20, formed integrally with the trace layer 16 and wire bonds 21, are connected to the contacts 19 within bond window 31 and electrically connect the chip 13 to the trace layer 16. Both lead bonds and wire bonds are shown in FIG. 1; in practice, an individual unit most often includes either lead bonds or wire bonds, although both may be used together.

Bumpers 22, 23 project from the bottom surface of the substrate 12. The bumpers are placed on the substrate prior to the stacking process. One bumper 23 is formed by the encapsulant which is used to cover the microelectronic device and connections 20, 21 in the central region of the chip and substrate. The other bumpers 22, disposed on opposite sides of bumper 23, are formed from additional masses of encapsulant. Preferably, all of the bumpers 22 and 23 project from the bottom surface 29 of the unit by a uniform projection distance or height h. The bumpers can be formed by applying an encapsulant material after the chip has been connected to the trace layer, i.e., after formation of the bonds 20 and 21. The encapsulant may be applied by conventional dispensing equipment of the type commonly used to apply encapsulant over wire bonds. The height of the bumpers will depend, to some extent, on controlled application of the encapsulant. To further enhance the height uniformity of the bumpers, the unit can be engaged with a mold such as a flat plate before the encapsulant is fully cured, so that the surface of the encapsulant remote from the remainder of the unit is formed by the mold.

Figure 2:
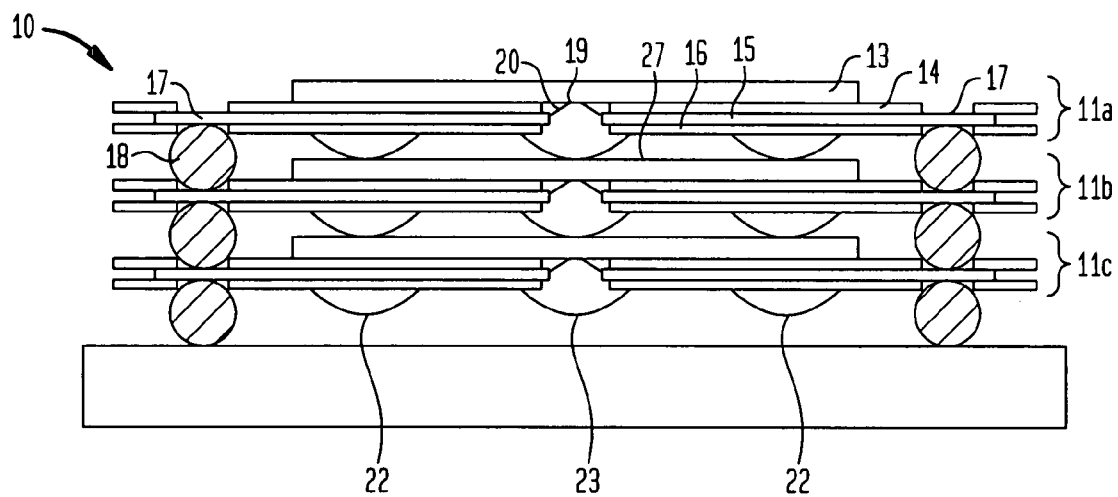
FIG. 2 is a view similar to FIG. 1, but depicting a plurality of units stacked together.

FIG. 2 depicts multiple units 11 superposed on one another in a stack. The solder balls or electrically conductive bonding material 18 serves as conductive elements which join the corresponding terminals of the various units into vertical conductive buses. Each solder ball makes contact with the terminal of one unit through an aperture in the solder mask layer 16 and with a terminal of the other unit through an aperture in the dielectric layer of the substrate 14 in that unit.

Figure 3:
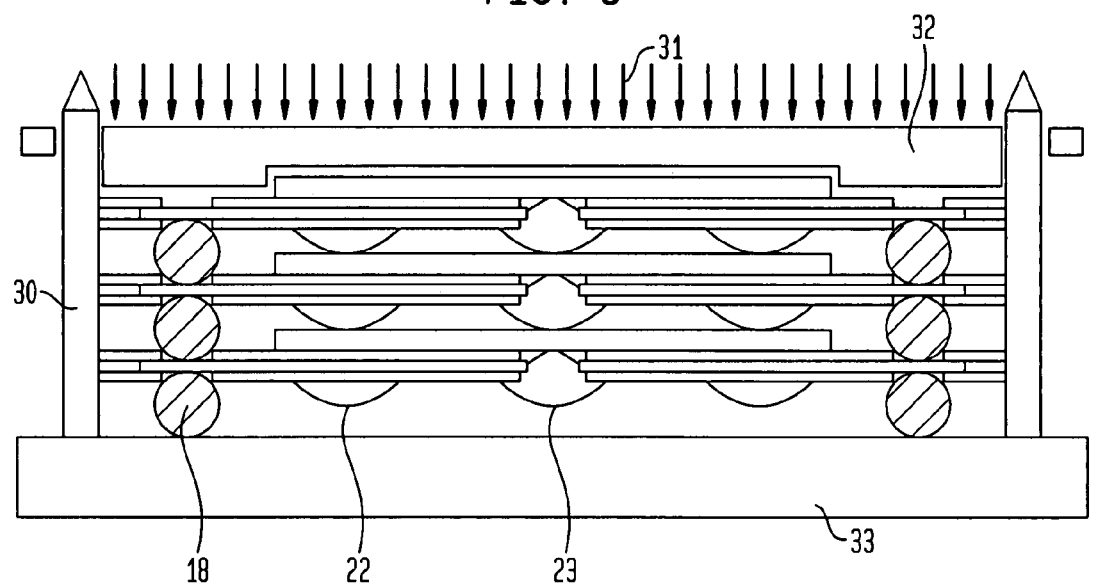
FIG. 3 is a view similar to FIG. 2, depicting the units of FIGS. 1 and 2 during an assembly process.

FIG. 3 depicts one example process for manufacturing and assembling the stacked package assembly 10. Initially, two or more separate units 11 are each preferably mounted to a mount or frame 30. Any suitable mount or frame may be utilized, such as one including top, bottom, or side portions.

Once all units are stacked as mentioned above, the assembly 10 is subjected to heat to reflow the electrically conductive bonding material 18 that is disposed between the units. This causes the units to become physically and electrically connected together. During reflow, the units are urged into engagement with one another. Typically, the surface tension of the bonding material provides substantial force tending to pull the units towards one another. For example, molten solder has appreciable surface tension. Also, the weight of the units will urge them into engagement with one another. Optionally, a downward pressure 31 is applied to an external fitted lid 32 to press the units together. The downward pressure may be applied by the weight of lid 32 itself or by an additional fixture (not shown). For example, a controlled force may be applied by an additional weight, or by a device such as a pneumatic or hydraulic cylinder, a solenoid, or any other known force-applying device. Use of a lid such as lid 32 to press the units together helps to flatten warped units. As the units are urged toward one another, the bumpers 22 and 23 of each unit abut the top surface 27 of the next adjacent unit 11. The abutment controls the spacing between units 11.

After the reflow operation, the lid 32, frame 30, or both may be removed. By controlling the spacing between units, the bumpers assure that the overall assembly will have a closely-controlled height. Moreover, the plural bumpers spaced apart over in the horizontal direction (the direction along the top and bottom surfaces of the units) maintain the surfaces of the units substantially parallel to one another. If any unit is warped, that unit will be brought back to a substantially planar condition by the force applied through the bumpers.

In the embodiment depicted in FIG. 3, the units are stacked on top of a circuit panel 33 during the reflow operation, and the bottom unit in the stack is bonded to the circuit panel by conductive bonding material 18 during the reflow operation. In other embodiments, the bottom unit in the stack is not bonded to the circuit panel at the same time as the units are bonded to one another. For example, the frame 30 may be mounted on a temporary fixture instead of on the circuit panel 33. The conductive elements 18 on the bottom unit may be omitted, so that the stacked units are not bonded to the fixture. The stacked units, bonded to one another by the bonding material 18 between the units, can be removed from the fixture as an assembly. This assembly can be handled and shipped in the same manner as an individual semiconductor package. The assembly can be mounted to a circuit panel by conventional surface-mounting techniques. The bonding material used to mount the assembly to a circuit panel may have a reflow temperature lower than the reflow temperature of the bonding material which connects the units to one another.

Figure 4:
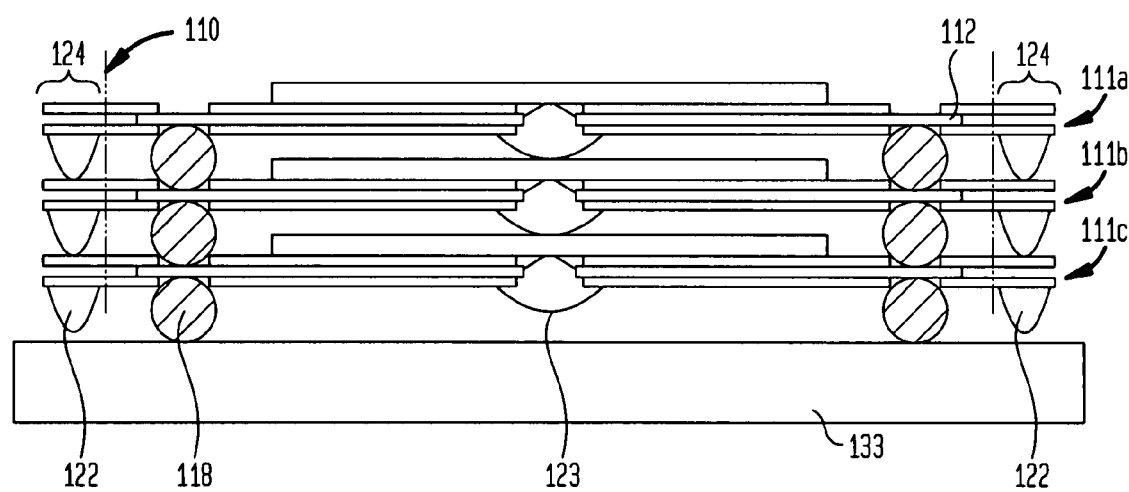
FIG. 4 diagrammatic sectional view of a stacked package assembly used in another embodiment of the invention.

FIG. 4 depicts another embodiment of the assembly 110 which includes similar elements to the above described assembly 10 in FIG. 2. However, the unit substrates 112 of units 111 of assembly 110 have removable tabs 124 disposed outside of the rows of electrically conductive bonding material 118. Bumpers 122 overlie the tabs 124 of each unit 111. The assembly 110 is subjected to the reflow process and pressure is applied via an external lid in the same manner as shown in FIG. 3 so that the bumpers 122 abut the next adjacent unit. Once the assembly 110 has cooled, the tabs 124 may be removed along with the attached bumpers 122 on the tabs.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

For example, the bumpers need not be formed from an encapsulant. In the embodiment of FIG. 4, for example, bumpers can be formed by folding portions of the unit substrate over on itself at the edges. In other embodiments, the bumpers can be formed separately from the units and inserted between the units when the units are placed in the stack. Such separately-formed bumpers can be removed after the reflow operation.

In some embodiments, bumpers have apexes disposed at locations on the surfaces of the bumpers which are farthest from the chip. For example, bumper 22 and bumper 23, as shown in FIG. 1, have apexes 22a, 23a disposed at locations on surfaces of the bumpers which are farthest from the chip. Further, bumper 124 and bumper 123, as shown in FIG. 4, can have similar shape and relationship.

The invention claimed is:

1. A stacked semiconductor chip assembly comprising:
    a plurality of units, each unit including a substrate and a microelectronic component attached thereto, each unit having top and bottom surfaces;
    a plurality of bumpers disposed between at least one pair of adjacent units, said bumpers adapted to maintain top and bottom surfaces of respective adjacent units substantially parallel to one another;
    said units being superposed on one another in a stack such that said bumpers provide a support structure between said top and bottom surfaces of adjacent units;
    bonding material electrically connecting adjacent ones of said superposed units;
    and at least one tab provided at a periphery of at least one said unit, said at least one tab being attached to at least one of said bumpers, wherein said at least one tab and at least one bumper are removable from said assembly.

2. The assembly of claim 1 wherein the bonding material electrically connects the units in the stack to form a plurality of vertical buses.

3. The assembly of claim 1 further comprising a lid overlying a top most unit in the stack.

4. The assembly of claim 1 wherein each said unit comprises a central region and a peripheral region and wherein at least one of said bumpers is disposed in a peripheral region.

5. The assembly of claim 4 wherein at least one of said units includes a bond window in said central region and wire bonds protruding through the window forming electrical connections with said microelectronic component.

6. The unit in claim 5 further comprising an encapsulant in said bond window, said encapsulant defining one of said plurality of bumpers.

7. The assembly of claim 1 wherein said units are mechanically joined by said bonding material, said bonding material being electrically conductive.

8. The assembly of claim 7 wherein said electrically conductive bonding material is solder.

9. The assembly of claim 7 wherein said electrically conductive bonding material is reflowable.

10. The assembly of claim 9 wherein said bumpers are adapted to limit collapse of said reflowable bonding material.

11. The assembly of claim 1 wherein said bumpers control spacing between said units.

12. The assembly of claim 1 wherein said bumpers are adapted to correct warpage of said units in said stack.

13. The assembly of claim 1 wherein said units are joined by electrically conductive bus elements.

14. The assembly of claim 1 wherein said bumpers have a specific height.

15. The assembly of claim 14 further comprising an encapsulant, and
    wherein said height of said bumper depends on controlled application of said encapsulant.

16. The assembly of claim 1 wherein said bumpers have apexes disposed at locations on surfaces of the bumpers which are farthest from the chip.

* * * * *

UNITED STATES PATENT AND TRADEMARK OFFICE
CERTIFICATE OF CORRECTION

| | |
|---|---|
| PATENT NO. | : 7,683,468 B2 |
| APPLICATION NO. | : 11/645016 |
| DATED | : March 23, 2010 |
| INVENTOR(S) | : Belgacem Haba and Ilyas Mohammed |

Page 1 of 1

It is certified that error appears in the above-identified patent and that said Letters Patent is hereby corrected as shown below:

Column 1, line 49 "6,077,440" should read --6,977,440--.

Signed and Sealed this
Twenty-second Day of March, 2011

David J. Kappos
*Director of the United States Patent and Trademark Office*